United States Patent [19]
Andoh

[11] Patent Number: 6,027,865
[45] Date of Patent: Feb. 22, 2000

[54] METHOD FOR ACCURATE PATTERNING OF PHOTORESIST DURING LITHOGRAPHY PROCESS

[75] Inventor: Katsuyoshi Andoh, Tokyo, Japan

[73] Assignee: Texas Instruments Incorporated, Dallas, Tex.

[21] Appl. No.: 09/016,614

[22] Filed: Jan. 30, 1998

Related U.S. Application Data

[60] Provisional application No. 60/037,888, Feb. 10, 1997.

[51] Int. Cl.[7] ...................................................... G03C 5/00
[52] U.S. Cl. ......................... 430/396; 430/311; 430/322; 355/53; 355/67; 355/71
[58] Field of Search .................................. 355/67, 53, 71; 430/311, 313, 322, 323, 327, 396

[56] References Cited

U.S. PATENT DOCUMENTS

| | | | |
|---|---|---|---|
| 5,348,837 | 9/1994 | Fukuda et al. | 430/269 |
| 5,363,172 | 11/1994 | Tokuda | 355/71 |
| 5,608,576 | 3/1997 | Han et al. | 359/562 |
| 5,631,773 | 5/1997 | Suzuki | 359/562 |
| 5,724,122 | 3/1998 | Oskotsky | 285/67 |
| 5,726,740 | 3/1998 | Shiozawa et al. | 355/67 |
| 5,739,899 | 4/1998 | Nishi et al. | 355/53 |
| 5,844,727 | 12/1998 | Partlo | 359/710 |

*Primary Examiner*—Sharon Gibson
*Assistant Examiner*—Jill N. Holloman
*Attorney, Agent, or Firm*—Robby T. Holland; Wade James Brady, III; Richard L. Donaldson

[57] ABSTRACT

A method is provided for accurate patterning of photoresist during lithography process. A photoresist layer is deposited on a surface of a semicondictor wafer. The photoresist layer is then illuminated using a lithography apparatus including a mask, a two-thirds annular aperture stop and a quadra pole aperture stop. Portions of the photoresist layer are removed to provide a resulting patterned photoresist layer.

14 Claims, 2 Drawing Sheets

METHOD FOR ACCURATE PATTERNING OF PHOTORESIST DURING LITHOGRAPHY PROCESS

This is a Non Provisional application filed under 35 USC 119(e) and claims priority of prior provisional, Ser. No. 60/037,888 of inventor Katsuyoshi Ando filed Feb. 10, 1997.

TECHNICAL FIELD OF THE INVENTION

This invention relates in general to the field of semiconductor device fabrication, and more particularly, to a method for accurate patterning of photoresist during a lithography process.

BACKGROUND OF THE INVENTION

The fabrication of semiconductor devices typically includes at least one process step where photoresist is patterned during a lithography process. In general, a lithography process step includes the use of a mask and a light source to expose and pattern an underlying photoresist layer. The photoresist can be either a positive or negative photoresist. After exposure, the exposed (positive photoresist) or unexposed (negative photoresist) portions of the photoresist are removed leaving a patterned layer of photoresist for the next process step. When forming minute patterns for ultra large scale integration (ULSI), a projection and reduction exposure method is typically used. This type of method is particularly useful for ULSI as very small patterns can be resolved because mask precision is also reduced. A lithography process step can be used, for example, to pattern a photoresist layer to serve as an etch mask.

After a lithography process step, it is important for the resulting photoresist pattern to be faithful with respect to the mask that was used. However, when using positive tone photoresist, the resulting pattern generally is thinner or narrower than the mask, and when using negative tone photoresist, the resulting pattern generally is thicker or wider than the mask. Thus, a photoresist deformation value must be estimated and accounted for when the mask is designed. For USLI circuits such as those having sub-half micron features, the relative difference between the resulting photoresist pattern and the mask pattern becomes even greater. For conventional lithography processes, this deformation value can be too large to allow a mask to be constructed for very small scales.

SUMMARY OF THE INVENTION

In accordance with the present invention, a method for accurate patterning of photoresist during a lithography process is provided that substantially reduces or eliminates problems and disadvantages of prior lithography processes.

According to one embodiment of the present invention, a method is provided for accurate patterning of photoresist during lithography process. A photoresist layer is deposited on a surface of a semicondictor wafer. The photoresist layer is then illuminated using a lithography apparatus including a mask, a two-thirds annular aperture stop and a quadra pole aperture stop. Portions of the photoresist layer are removed to provide a resulting patterned photoresist layer.

A technical advantage of the present invention is the use of modified illumination during exposure of photoresist in a lithography process to reduce pattern deformation and to produce accurate ULSI sized features for the resulting photoresist pattern. Specifically, the illumination is accomplished using a two-thirds annular aperture or a quadra pole aperture. The present invention therefore provides a mask layout that can be produced more easily and that produces a higher precision photoresist pattern which can increase yield for sub-half micron patterns.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION OF THE INVENTION

Figure 1:
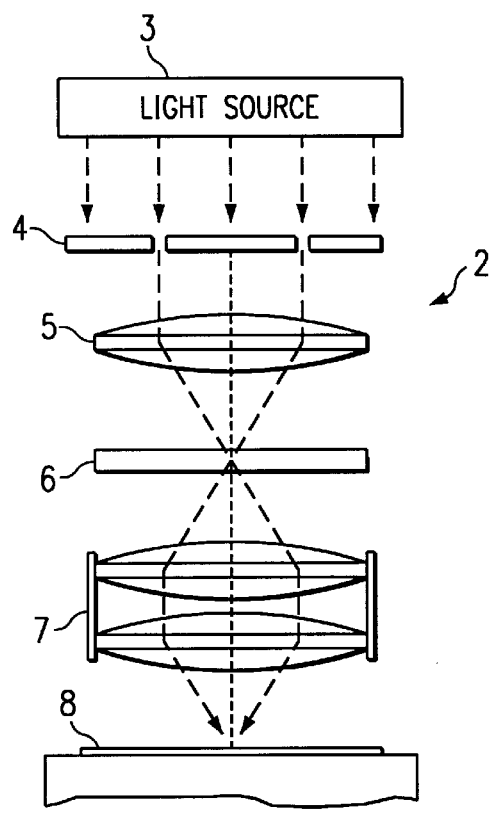
FIG. 1 is a diagram of one embodiment of a projection and reduction exposure lithography apparatus.

FIG. 1 is a diagram of one embodiment of a projection and reduction exposure lithography apparatus, indicated generally at 2. Apparatus 2 includes a light source 3 which provides light, such as ultraviolet light, for exposing photoresist layers. An aperture stop 4 is positioned between the light source and a condenser lens 5. Light is collected by condenser lens 5 and focused by condenser lens 5 on a mask 6 such that the mask is illuminated. When the light passes through mask 6, a pattern image is created which is projected through projection lens 7 onto a photoresist layer on semiconductor wafer 8. One aspect of apparatus 2 is its resolution limit and another is its depth of focus. The resolution limit is the minimum feature that apparatus 2 can repeatedly expose on the surface of wafer 8. The depth of focus is the range in which the pattern image will stay in focus. The present invention addresses improving both the resolution limit and the depth of focus so that the patterned photoresist is accurate with respect to the desired pattern.

Figure 2A:
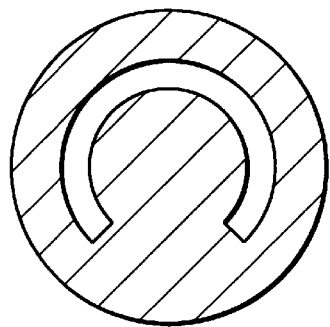
FIGS. 2A and 2B are diagrams of a two-thirds annular aperture stop and a quadra pole aperture stop.
Figure 2B:
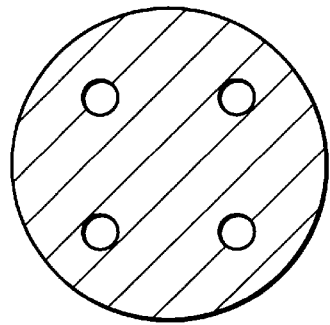

FIG. 2A is diagram of a two-thirds annular aperture stop, and FIG. 2B is a diagram of a quadra pole aperture stop for use in an apparatus such as that of FIG. 1. As can be seen, the two-thirds annular aperture stop has an annular opening extending two-thirds of the perimeter of the aperture stop for allowing the light to pass. The quadra pole aperture stop has four openings for allowing light to pass. Other types of aperture stops include circular openings centered in the aperture stop.

Figure 3A:
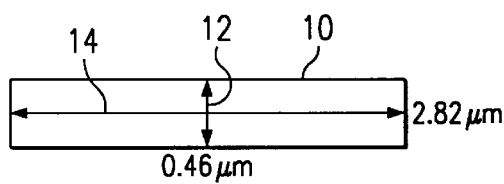
FIGS. 3A, 3B, 3C, 3D, and 3E show a sub-half micron moat region and photoresist patterns resulting from illumination using a number of aperture stops in a lithography process.

FIG. 3A shows one embodiment of a sub-half micron moat pattern 10 of a mask for use during a lithography process. Moat pattern 10 as a width 12 and a length 14. In the embodiment of FIG. 3A, moat pattern 10 has a width 12 equal to 0.46 microns ($\mu$m) and a length 14 equal to 2.82 microns ($\mu$m). FIGS. 3B, 3C, 3D and 3E show photoresist patterns that result from the use of moat pattern 10 as a mask and the use of different aperture stops for illumination of a positive photoresist. It should be understood that this discussion of a moat pattern is for purposes of explanation and is not intended nor should be construed to limit the scope of the present invention. For example, the present method for accurate patterning is applicable to patterning other device features and other types of layers, such as silicon-nitride layers.

Figure 3B:
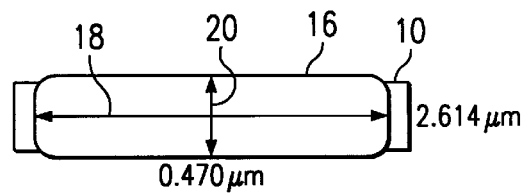

FIG. 3B shows a photoresist pattern 16 resulting from illumination using a sigma 0.6, NA 0.50 aperture stop with the mask pattern 10 of FIG. 3A. Photoresist pattern 16 has a width 18 and a length 20. Based upon the use of the sigma 0.6, NA 0.50 aperture stop, photoresist pattern 16 has a width 18 equal to 0.470 microns (μm) and a length 20 equal to 2.614 microns (μm). As can be seen, the illumination using the sigma 0.6, NA 0.50 aperture stop produced photoresist region 16 that has length 20 that is smaller than length 14 of moat pattern 10. Specifically, length 20 is smaller by 0.206 microns (μm).

Figure 3C:
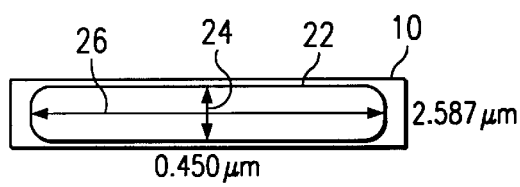

FIG. 3C shows a photoresist pattern 22 resulting from illumination using a sigma 0.6, NA 0.57 aperture stop with the mask pattern 10 of FIG. 3A. Photoresist pattern 22 has a width 24 and a length 26. Based upon the use of the sigma 0.6, NA 0.57 aperture stop, photoresist pattern 22 has a width 24 equal to 0.450 microns (μm) and a length 26 equal to 2.587 microns (μm). As can be seen, the illumination using the sigma 0.6, NA 0.57 aperture stop produced photoresist region 16 that has length 26 that is smaller than length 14 of moat pattern 10. Specifically, length 26 is smaller by 0.233 microns (μm).

Figure 3D:
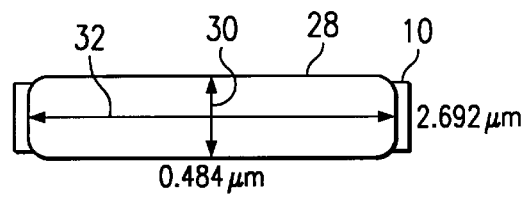

FIG. 3D shows a photoresist pattern 28 resulting from modified illumination using a two-thirds annular aperture stop with the mask pattern 10 of FIG. 3A. Photoresist pattern 28 has a width 30 and a length 32. Based upon the use of the two-thirds annular aperture stop, photoresist pattern 28 has a width 30 equal to 0.484 microns (μm) and a length 32 equal to 2.692 microns (μm). As can be seen, the illumination using the two-thirds annular aperture stop produced photoresist region 28 that has length 30 that is smaller than length 14 of moat pattern 10. Specifically, length 30 is smaller by 0.128 microns (μm).

Figure 3E:
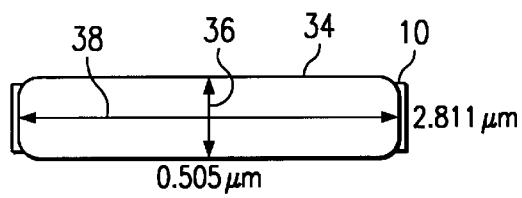

FIG. 3E shows a photoresist pattern 34 resulting from modified illumination using a quadra pole aperture stop with the mask pattern 10 of FIG. 3A. Photoresist pattern 34 has a width 36 and a length 38. Based upon the use of the quadra pole aperture stop, photoresist pattern 34 has a width 36 equal to 0.505 microns (μm) and a length 38 equal to 2.811 microns (μm). As can be seen, the modified illumination using the quadra pole aperture stop produced photoresist region 34 that has length 38 that is smaller than length 14 of moat pattern 10. Specifically, length 38 is smaller by 0.009 microns (μm).

As can be seen from FIGS. 3B, 3C, 3D and 3E, the modified illumination using the two-thirds annular aperture or the quadra pole aperture produces a more accurate photoresist pattern during a lithography process. This is especially true with respect to matching the length of moat pattern 10. The following tables provide empirically measured data with respect to the geometry of moat pattern 10 and the various aperture stops used for illumination.

TABLE 1

NA 0.50 aperture stop
Exp. .560 msec; focus +0.2 μm

|  |  | Design | Average | 3S |
|---|---|---|---|---|
| Std Moat Width 5 pts |  |  |  |  |
| MP.1 | LL | 0.46 | 0.460 | 0.020 |
| MP.2 | LL | 0.46 | 0.468 | 0.067 |
| MP.3 | CE | 0.46 | 0.488 | 0.040 |
| MP.4 | LR | 0.46 | 0.456 | 0.048 |
| MP.5 | UR | 0.46 | 0.489 | 0.058 |

TABLE 1-continued

NA 0.50 aperture stop
Exp. .560 msec; focus +0.2 μm

|  |  | Design | Average | 3S |
|---|---|---|---|---|
| Moat Width Split |  |  |  |  |
| MP.6 | WIDTH | 0.46 | 0.470 | 0.032 |
| MP.7 | SPACE | 0.30 | 0.506 | 0.053 |
| MP.8 | WIDTH | 0.46 | 0.471 | 0.024 |
| MP.9 | SPACE | 0.28 | 0.492 | 0.086 |
| MP.10 | WIDTH | 0.46 | 0.464 | 0.038 |
| MP.11 | SPACE | 0.26 | 0.445 | 0.058 |
| MP.12 | WIDTH | 0.46 | 0.472 | 0.041 |
| MP.13 | SPACE | 0.24 | 0.436 | 0.100 |

TABLE 2

NA 0.57 aperture stop
Exp. .560 msec; focus +0.2 μm

|  |  | Design | Average | 3S |
|---|---|---|---|---|
| Std Moat Width 5 pts |  |  |  |  |
| MP.1 | LL | 0.46 | 0.457 | 0.024 |
| MP.2 | LL | 0.46 | 0.458 | 0.042 |
| MP.3 | CE | 0.46 | 0.458 | 0.024 |
| MP.4 | LR | 0.46 | 0.448 | 0.033 |
| MP.5 | UR | 0.46 | 0.456 | 0.042 |
| Moat Width Split |  |  |  |  |
| MP.6 | WIDTH | 0.46 | 0.451 | 0.052 |
| MP.7 | SPACE | 0.30 | 0.533 | 0.070 |
| MP.8 | WIDTH | 0.46 | 0.455 | 0.029 |
| MP.9 | SPACE | 0.28 | 0.520 | 0.065 |
| MP.10 | WIDTH | 0.46 | 0.450 | 0.049 |
| MP.11 | SPACE | 0.26 | 0.489 | 0.045 |
| MP.12 | WIDTH | 0.46 | 0.445 | 0.024 |
| MP.13 | SPACE | 0.24 | 0.464 | 0.086 |

TABLE 3 two-thirds annular aperture stop
Exp. .600 msec; Focus +0.2 μm

|  |  | Design | Average | 3S |
|---|---|---|---|---|
| Std Moat Width 5pts |  |  |  |  |
| MP.1 | LL | 0.46 | 0.475 | 0.068 |
| MP.2 | LL | 0.46 | 0.489 | 0.048 |
| MP.3 | CE | 0.46 | 0.487 | 0.024 |
| MP.4 | LR | 0.46 | 0.483 | 0.041 |
| MP.5 | UR | 0.46 | 0.436 | 0.046 |
| Moat Width Split |  |  |  |  |
| MP.6 | WIDTH | 0.46 | 0.484 | 0.028 |
| MP.7 | SPACE | 0.30 | 0.428 | 0.018 |
| MP.8 | WIDTH | 0.46 | 0.488 | 0.040 |
| MP.9 | SPACE | 0.28 | 0.417 | 0.035 |
| MP.10 | WIDTH | 0.46 | 0.479 | 0.028 |
| MP.11 | SPACE | 0.26 | 0.394 | 0.041 |
| MP.12 | WIDTH | 0.46 | 0.485 | 0.024 |
| MP.13 | SPACE | 0.24 | 0.363 | 0.063 |

TABLE 4 quadra pole aperture stop
Exp. .550 msec; focus +0.2 μm

|  |  | Design | Average | 3S |
|---|---|---|---|---|
| Std Moat Width 5 pts |  |  |  |  |
| MP.1 | LL | 0.46 | 0.509 | 0.023 |
| MP.2 | LL | 0.46 | 0.473 | 0.051 |
| MP.3 | CE | 0.46 | 0.506 | 0.024 |
| MP.4 | LR | 0.46 | 0.500 | 0.012 |
| MP.5 | UR | 0.46 | 0.480 | 0.038 |
| Moat Width Split |  |  |  |  |
| MP.6 | WIDTH | 0.46 | 0.505 | 0.029 |
| MP.7 | SPACE | 0.30 | 0.309 | 0.033 |
| MP.8 | WIDTH | 0.46 | 0.503 | 0.015 |
| MP.9 | SPACE | 0.28 | 0.277 | 0.046 |
| MP.10 | WIDTH | 0.46 | 0.510 | 0.030 |
| MP.11 | SPACE | 0.26 | 0.215 | 0.086 |
| MP.12 | WIDTH | 0.46 | 0.513 | 0.042 |
| MP.13 | SPACE | 0.24 | n/a | n/a |

The use of the NA 0.50 and 0.57 aperture stops does not overcome the shrinkage problem for ULSI devices. However, by using a two-thirds annular and a quadra pole aperture stop, the shrinkage problem can be overcome.

Figure 4:
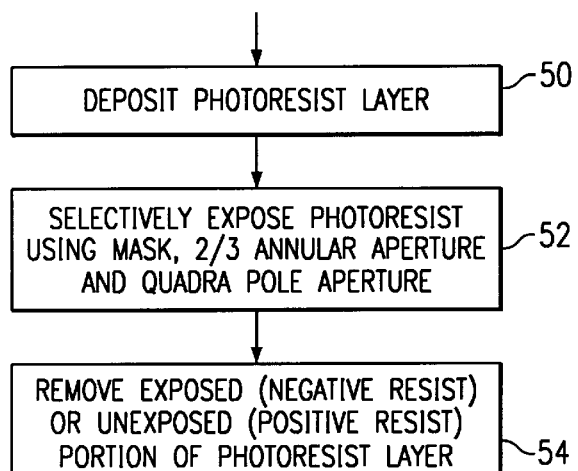
FIG. 4 is a flow chart of a method for accurate patterning of photoresist during a lithography process.

FIG. 4 is a flow chart of one embodiment of a method for accurate patterning of photoresist during lithography process. In step 50, a layer of photoresist is deposited on the surface of a semiconductor wafer. This photoresist can be a negative or positive photoresist depending upon the desired application. Then, in step 52, the photoresist layer is selectively exposed using a mask and a two-thirds annular aperture stop and a quadra pole aperture stop. In step 54, the unexposed (negative photoresist) or the exposed (positive photoresist) portion of the photoresist layer is removed. This leaves behind a photorist mask layer that accurately reflects the mask pattern for USLI designs. In particular, this method of patterning reduces the deformation value for the photoresist thus allowing sub-half micron designs to be realized.

Although the present invention has been described in detail, it should be understood that various changes, substitutions and alterations can be made thereto without departing from the spirit and scope of the invention as defined by the appended claims.

What is claimed is:

1. A method for accurate patterning of photoresist during a lithography process, comprising the steps of:
   depositing a photoresist layer on a surface of a semiconductor wafer;
   illuminating the photoresist layer through a mask using a lithography apparatus comprising said mask, two-thirds a annular aperture stop, and a quadra pole aperture stop; wherein the illumination is performed through the mask and one of the two-thirds annular aperture stop or quadra pole aperture stop and removing portions of the photoresist layer responsive to said illuminating the photoresist through said mask to provide a resulting patterned photoresist layer.

2. The method of claim 1, wherein the lithography apparatus is a projection and reduction exposure lithography apparatus having a condenser lens and a projection lens.

3. The method of claim 2 wherein said aperture stop is said two-thirds annular aperture stop alone.

4. The method of claim 1, wherein the mask is used to pattern the photoresist layer to make sub-half micron device features.

5. The method of claim 4 wherein said aperture stop is said two-thirds annular aperture stop alone.

6. The method of claim 1, wherein the photoresist layer is a positive photoresist, and exposed portions of the photoresist layer are removed.

7. The method of claim 6 wherein said aperture stop is said two-thirds annular aperture stop alone.

8. The method of claim 1, wherein the photoresist layer is a negative photoresist, and unexposed portions of the photoresist layer are removed.

9. The method of claim 8 wherein said aperture stop is said two-thirds annular aperture stop alone.

10. The method of claim 1, wherein the resulting photoresist mask is used for an etch mask.

11. The method of claim 10 wherein said aperture stop is said two-thirds annular aperture stop alone.

12. The method of claim 1, wherein the resulting photoresist mask is used for an etch mask to cover moat regions.

13. The method of claim 12 wherein said aperture stop is said two-thirds annular aperture stop alone.

14. The method of claim 1 wherein said aperture stop is said two-thirds annular aperture stop alone.

* * * * *